United States Patent
Kuo

(10) Patent No.: US 8,054,114 B2
(45) Date of Patent: Nov. 8, 2011

(54) FRACTIONAL-N PHASE-LOCKED LOOP

(75) Inventor: Chun-Cheng Kuo, Tainan (TW)

(73) Assignee: Himax Technologies Limited, Tainan County (TW)

(*) Notice: Subject to any disclaimer, the term of this patent is extended or adjusted under 35 U.S.C. 154(b) by 1 day.

(21) Appl. No.: 12/690,752

(22) Filed: Jan. 20, 2010

(65) Prior Publication Data

US 2011/0175652 A1 Jul. 21, 2011

(51) Int. Cl.
*H03L 7/06* (2006.01)
(52) U.S. Cl. ......... 327/156; 327/147; 327/148; 327/158
(58) Field of Classification Search .............. 327/147, 327/156
See application file for complete search history.

(56) References Cited

U.S. PATENT DOCUMENTS

| | | | |
|---|---|---|---|
| 6,559,698 B1* | 5/2003 | Miyabe | 327/157 |
| 7,301,404 B2* | 11/2007 | Mattisson | 331/2 |
| 2008/0265998 A1* | 10/2008 | Wood | 331/2 |

* cited by examiner

*Primary Examiner* — Lincoln Donovan
*Assistant Examiner* — John Poos
(74) *Attorney, Agent, or Firm* — Stout, Uxa, Buyan & Mullins, LLP

(57) ABSTRACT

A fractional-N phase-locked loop (PLL) includes a phase detector, a voltage-controlled oscillator (VCO), a frequency divider and a frequency multiplier with a multiplication factor of a mixed number. The phase detector compares phase difference between a reference frequency and a divided signal from the frequency divider. The voltage-controlled oscillator generates the output frequency according to the phase difference. The frequency multiplier performs frequency multiplication on the output frequency to generate a multiplied signal, and the frequency multiplier comprises a second phase-locked loop, to form a second loop. The frequency divider performs frequency division on the multiplied signal to generate the divided signal. The divided signal and the reference frequency are compared by the phase detector to determine the phase difference.

10 Claims, 2 Drawing Sheets

FRACTIONAL-N PHASE-LOCKED LOOP

BACKGROUND OF THE INVENTION

1. Field of the Invention

The present invention generally relates to a phase-locked loop (PLL), and more particularly to a nested fractional-N PLL.

2. Description of Related Art

A phase-locked loop (PLL) is a control system that uses a negative feedback to generate an output frequency that is phase-locked to a reference frequency. The PLL is widely used in a variety of applications, such as synthesizing a stable frequency or recovering a signal from a communication channel. The ratio of the output frequency to the reference frequency of the PLL may be a whole number, or may be a mixed number that is the sum of a whole number and a fraction. The former is commonly known as an integer-N PLL or synthesizer, and the latter is commonly known as a fractional-N PLL or synthesizer. A delta-sigma synthesizer with a delta sigma modulator (SDM) is a popular one among various types of fractional-N synthesizers. Nevertheless, the SDM generates quantization noise that incurs output clock jitter. In order to alleviate the clock jitter effect, a capacitor with large capacitance (e.g., more than thousands of picofarads (pF)) may be used to filter the quantization noise, but at a cost of increased circuit area and power consumption.

For the reason that conventional PLL could not effectively reduce the clock jitter in the delta-sigma synthesizer, a need has arisen to propose a novel scheme for filtering quantization noise in an effective manner without substantively increasing circuit area.

SUMMARY OF THE INVENTION

In view of the foregoing, it is an object of the embodiment of the present invention to provide a fractional-N phase-locked loop (PLL) that may effectively filter quantization with capacitors of acceptable values.

According to one embodiment, a fractional-N PLL includes a first PLL loop and a second PLL loop. In the first PLL loop, a first phase detector compares first phase difference to generate a first error signal indicative of the first phase difference. A first voltage-controlled oscillator (VCO) generates an output frequency according to the first error signal. A frequency multiplier performs frequency multiplication on the output frequency to generate a multiplied signal, where the frequency multiplier comprises a second phase-locked loop, thereby forming a second loop therein. A first frequency divider performs frequency division on the multiplied signal to generate a first divided signal, where the first divided signal and a reference frequency are then compared by the first phase detector to determine the first phase difference. In one embodiment, the frequency multiplier includes a second PLL loop that has a bandwidth wider than the bandwidth of the first PLL loop.

DETAILED DESCRIPTION OF THE INVENTION

Figure 1:
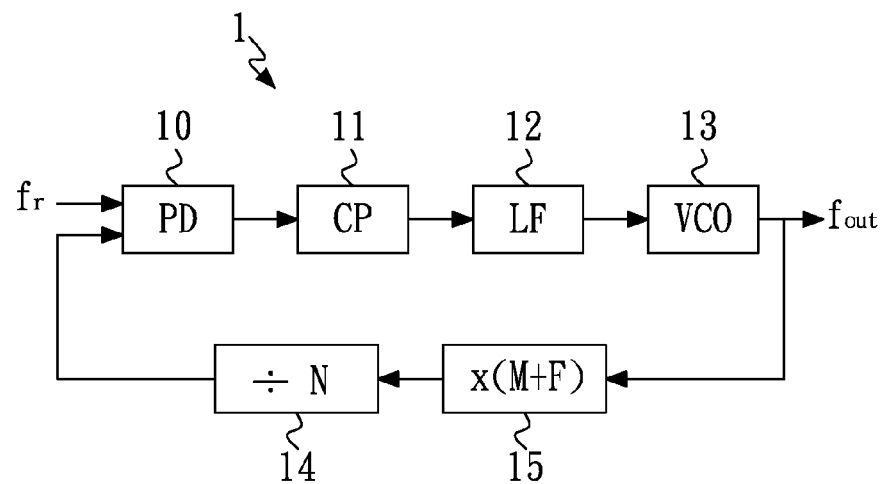
FIG. 1 is a functional block diagram that illustrates a fractional-N phase-locked loop (PLL) according to one embodiment of the present invention.

FIG. 1 is a functional block diagram illustrating a fractional-N phase-locked loop (PLL) 1 according to one embodiment of the present invention. In the embodiment, the PLL 1 includes a phase detector (PD) 10, a charge pump (CP) 11, a loop filter (LF) 12, a voltage-controlled oscillator (VCO) 13, a frequency divider 14 and a frequency multiplier 15. The phase detector 10, in the embodiment, is preferably a phase frequency detector (PFD) that compares phase difference between a reference frequency $f_r$ and a divided signal from the frequency divider 14 in order to generate an error signal indicative of the phase difference. The charge pump 11 controls a charge pump current according to the error signal from the phase detector 10. The loop filter 12 may, for example, be a low-pass filter that smoothes an output of the charge pump 11 to generate a filtered signal, and the loop filter 12 may primarily include a resistor-capacitor (RC) circuit. The voltage-controlled oscillator 13 generates output frequency $f_{out}$ proportional to the filtered signal or indirectly according to the error signal from the phase detector 10. The frequency multiplier 15 performs frequency multiplication on the output frequency $f_{out}$ to generate a multiplied signal. In the embodiment, the multiplication factor of the frequency multiplier 15 is a mixed number that is the sum of a whole number M and a fraction F. The frequency divider 14 performs frequency division on the multiplied signal to generate the divided signal. In the embodiment, the division factor of the frequency divider 14 is a whole number N. It is noted that all the blocks except the frequency multiplier 15 of the PLL 1 may be implemented using conventional PLL techniques.

Figure 2:
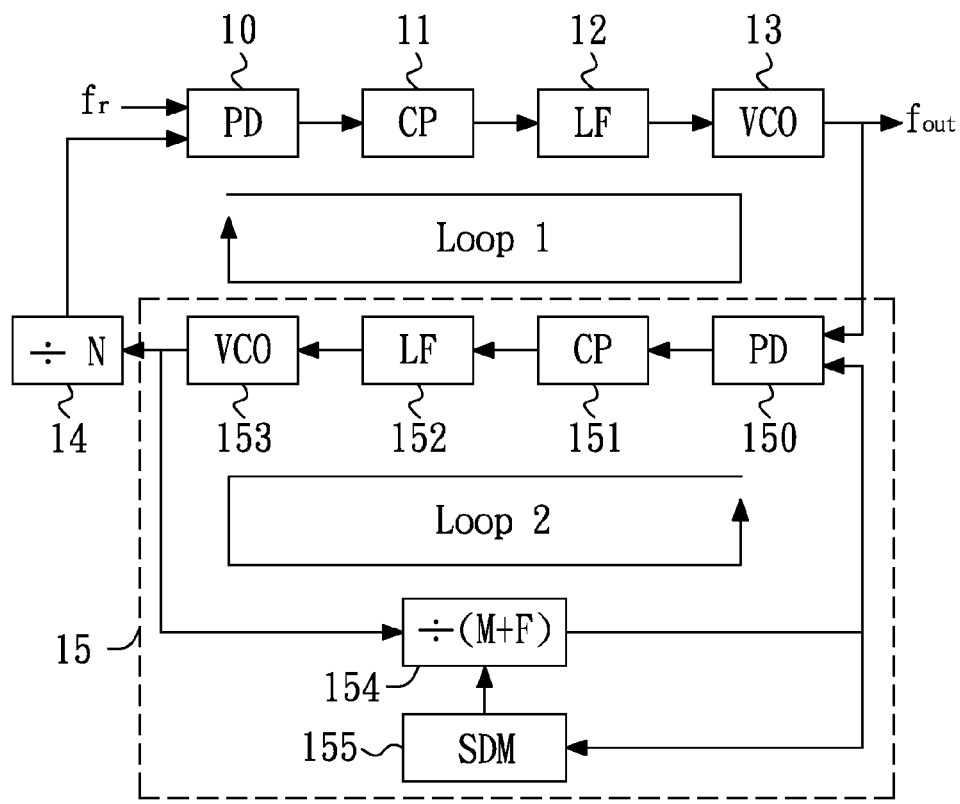
FIG. 2 shows a nested PLL according to one embodiment of the present invention.
Figure 3:
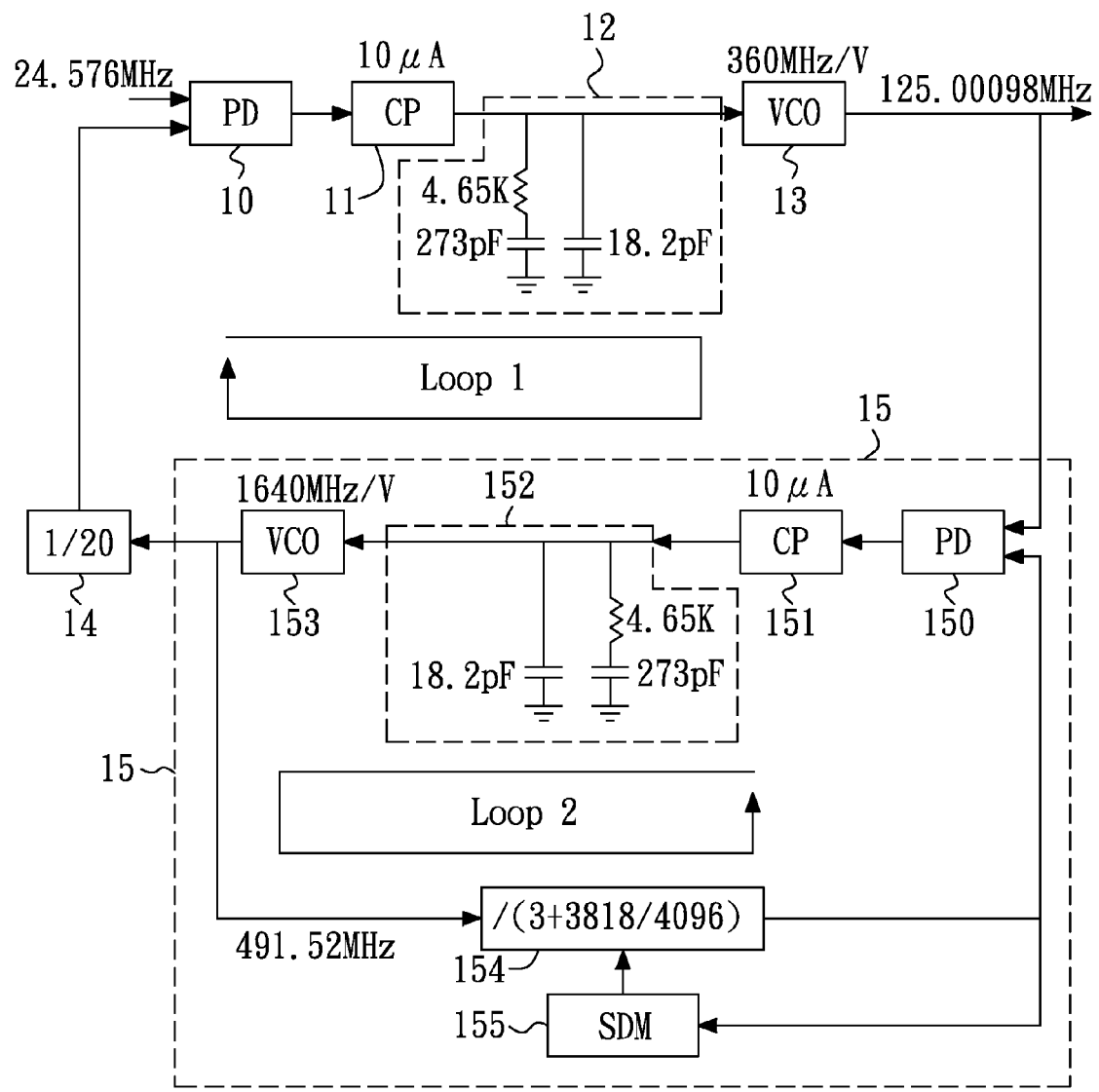
FIG. 3 shows an exemplary PLL implemented with exemplary design parameters.

In the embodiment, the frequency multiplier 15 may be implemented by a PLL structure, especially a sigma-delta modulator (SDM)-based fractional-N PLL, as shown in FIG. 2. An exemplary implementation with exemplary design parameters is shown in FIG. 3. Specifically, the frequency multiplier 15 includes a phase detector (PD) 150, a charge pump (CP) 151, a loop filter (LF) 152, a voltage-controlled oscillator (VCO) 153 and a frequency divider 154 with a division factor of (M+F). The function and the configuration of the blocks are similar to the blocks 11-14. Particularly, the phase detector 150 compares phase difference between the output frequency $f_{out}$ and the divided signal from the frequency divider 154. In addition, a sigma-delta modulator (SDM) 155 is used to provide the fraction F to the frequency divider 154 according to the divided signal from the frequency divider 154. In this specification, a prefix "first" may be added to the phase detector (PD) 10, the charge pump (CP) 11, the loop filter (LF) 12, the voltage-controlled oscillator (VCO) 13, the frequency divider 14, and their associated signals. A prefix "second" may be added to the phase detector (PD) 150, the charge pump (CP) 151, the loop filter (LF) 152, the voltage-controlled oscillator (VCO) 153, the frequency divider 154, and their associated signals.

According to the illustrated structure shown in FIG. 2, a multi-loop or nested PLL 1 is thus constructed. Although a two-loop PLL is exemplified in the embodiment, it is appreciated that a multi-loop PLL with more than two loops may be adapted as well. In the embodiment, the VCO gain (e.g., 360 MHz/V) of the VCO 13 in the first loop or the main loop of the PLL is smaller than the VCO gain (e.g., 1640 MHz/V) of the VCO 153 in the second loop within the frequency multiplier 15. The first loop has a bandwidth narrower than the second loop. As a result, the second loop may operate at a speed faster than the first loop. Accordingly, the second loop may firstly filter the quantization noise of the SDM, followed by secondly further filtering the quantization noise by the first loop with a narrower bandwidth.

According to the embodiment illustrated above, the nested fractional-N PLL may effectively filter quantization noise to reduce the output clock jitter, or may perform even more effectively than the conventional PLL does. More significantly, the nested fractional-N PLL uses a capacitor having capacitance substantially smaller than that in the conventional fractional-N PLL. For example, as shown in FIG. 3, a capacitor with 273 pF may sufficiently meet the requirement of filtering the quantization noise. As a result, the circuit area and power consumption of the disclosed nested fractional-N PLL may be substantively reduced.

Although specific embodiments have been illustrated and described, it will be appreciated by those skilled in the art that various modifications may be made without departing from the scope of the present invention, which is intended to be limited solely by the appended claims.

What is claimed is:

1. A fractional-N phase-locked loop (PLL), comprising:
   a first phase detector configured to compare first phase difference to generate a first error signal indicative of the first phase difference;
   a first voltage-controlled oscillator (VCO) configured to generate an output frequency according to the first error signal;
   a frequency multiplier configured to perform frequency multiplication on the output frequency to generate a multiplied signal, the frequency multiplier comprising a second phase-locked loop, thereby forming a second loop therein; and
   a first frequency divider configured to perform frequency division on the multiplied signal to generate a first divided signal, the first divided signal and a reference frequency being then compared by the first phase detector to determine the first phase difference;
   wherein the first phase detector, the first voltage-controlled oscillator, the frequency multiplier and the first frequency divider form a first loop.

2. The fractional-N PLL of claim 1, wherein the second loop has a bandwidth wider than a bandwidth of the first loop.

3. The fractional-N PLL of claim 1, wherein the second loop operates faster than the first loop.

4. The fractional-N PLL of claim 1, wherein the second phase-locked loop comprises:
   a second phase detector configured to compare second phase difference to generate a second error signal indicative of the second phase difference;
   a second charge pump configured to control a second charge pump current according to the second error signal from the second phase detector;
   a second loop filter configured to smooth an output of the second charge pump to generate a second filtered signal;
   a second voltage-controlled oscillator configured to generate the multiplied signal according to the second filtered signal; and
   a second frequency divider configured to perform frequency division on the multiplied signal to generate a second divided signal, the second divided signal and the output frequency being then compared by the second phase detector to determine the second phase difference.

5. The fractional-N PLL of claim 4, further comprising a sigma-delta modulator configured to provide the fraction of the multiplication factor according to the second divided signal.

6. The fractional-N PLL of claim 1, wherein the first phase detector is a phase frequency detector.

7. The fractional-N PLL of claim 1, further comprising a first charge pump configured to control a first charge pump current according to the first error signal from the first phase detector.

8. The fractional-N PLL of claim 7, further comprising a first loop filter configured to smooth an output of the first charge pump to generate a first filtered signal, which is further fed to the first voltage-controlled oscillator.

9. The fractional-N PLL of claim 8, wherein the first loop filter is a low-pass filter.

10. The fractional-N PLL of claim 9, wherein the first loop filter comprises resistor-capacitor circuit.

* * * * *